United States Patent
Nakamura et al.

(10) Patent No.: US 8,022,423 B2
(45) Date of Patent: Sep. 20, 2011

(54) STANDING TRANSPARENT MIRRORLESS LIGHT EMITTING DIODE

(75) Inventors: Shuji Nakamura, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 10 days.

(21) Appl. No.: 12/716,650

(22) Filed: Mar. 3, 2010

(65) Prior Publication Data

US 2010/0155762 A1    Jun. 24, 2010

Related U.S. Application Data

(63) Continuation of application No. 11/940,883, filed on Nov. 15, 2007, now Pat. No. 7,687,813.

(60) Provisional application No. 60/866,071, filed on Nov. 15, 2006.

(51) Int. Cl.
*H01L 33/00* (2010.01)
*H01L 21/00* (2010.01)

(52) U.S. Cl. ............... 257/95; 257/E33.059; 438/27

(58) Field of Classification Search ............ 257/95, 257/E33.059; 438/27
See application file for complete search history.

(56) References Cited

U.S. PATENT DOCUMENTS
5,416,870 A    5/1995    Chun et al.

(Continued)

FOREIGN PATENT DOCUMENTS
EP    1081771    3/2001

(Continued)

OTHER PUBLICATIONS

Fujii, T. et al., "Increase in the extraction efficiency of GaN-based light-emitting diodes via surface roughening," Appl. Phys. Lett., Feb. 9, 2004, vol. 84, No. 6, pp. 855-857.

(Continued)

*Primary Examiner* — W. David Coleman
(74) *Attorney, Agent, or Firm* — Gates & Cooper LLP

(57) ABSTRACT

An (Al, Ga, In)N light emitting diode (LED) in which multi-directional light can be extracted from one or more surfaces of the LED before entering a shaped optical element and subsequently being extracted to air. In particular, the (Al, Ga, In)N and transparent contact layers (such as ITO or ZnO) are embedded in or combined with a shaped optical element comprising an epoxy, glass, silicon or other material molded into an inverted cone shape, wherein most of the light entering the inverted cone shape lies within a critical angle and is extracted. In addition, the present invention stands the LED on end, i.e., rotates the position of the LED within the shaped optical element by approximately 90° as compared to a conventional LED, in order to extract light more effectively from the LED. The present invention also minimizes internal reflections within the LED by eliminating mirrors and/or mirrored surfaces, in order to minimize re-absorption of the LED's light by the emitting layer (or the active layer) of the LED. To assist in minimizing internal reflections, transparent electrodes, such as ITO or ZnO, may be used. Surface roughening by patterning or anisotropically etching (i.e., creating microcones) may also assist in light extraction, as well as minimizing internal reflections.

16 Claims, 8 Drawing Sheets

U.S. PATENT DOCUMENTS

| | | | |
|---|---|---|---|
| 5,780,867 | A | 7/1998 | Fritz et al. |
| 6,155,699 | A | 12/2000 | Miller et al. |
| 6,357,889 | B1 | 3/2002 | Duggal et al. |
| 6,373,188 | B1 | 4/2002 | Johnson et al. |
| 6,573,530 | B1 | 6/2003 | Sargent et al. |
| 6,607,286 | B2 | 8/2003 | West et al. |
| 6,674,096 | B2 | 1/2004 | Sommers |
| 6,746,295 | B2 | 6/2004 | Sorg |
| 6,961,190 | B1 | 11/2005 | Tamaoki et al. |
| 6,997,580 | B2 | 2/2006 | Wong |
| 7,135,709 | B1 | 11/2006 | Wirth et al. |
| 7,390,117 | B2 | 6/2008 | Leatherdale et al. |
| 7,414,270 | B2 | 8/2008 | Kim et al. |
| 2004/0211970 | A1 | 10/2004 | Hayashimoto et al. |
| 2005/0156510 | A1 | 7/2005 | Chua et al. |
| 2006/0139926 | A1* | 6/2006 | Morioka et al. ............ 362/260 |
| 2006/0243993 | A1 | 11/2006 | Yu |
| 2007/0001185 | A1 | 1/2007 | Lu et al. |
| 2007/0189013 | A1 | 8/2007 | Ford |
| 2008/0149949 | A1 | 6/2008 | Nakamura et al. |

FOREIGN PATENT DOCUMENTS

| | | |
|---|---|---|
| WO | 2005/083037 | 9/2005 |

OTHER PUBLICATIONS

Jasinski, J. et al., "Microstructure of GaAs/GaN interfaces produced by direct wafer fusion," Appl. Phys. Lett., Oct. 21, 2002, vol. 81, No. 17, pp. 3152-3154.

Kish, F.A. et al., "Very high-efficiency semiconductor wafer-bonded transparent-substrate $(Al_xGz_{1-x})0.5In0.5P/GaP$ light-emitting diodes," Appl. Phys. Lett., May 23, 1994, vol. 64, No. 21, pp. 2839-2841.

Liau, Z.L. et al., "Wafer fusion: A novel technique for optoelectronic device fabrication and monolithic integration," Appl. Phys. Lett., Feb. 19, 1990, vol. 56, No. 8, pp. 737-739.

Murai, A. et al., "Wafer Bonding of GaN and ZnSSe for Optoelectronic Applications," Jpn. J. Appl. Phys., 2004, vol. 43, No. 10A, pp. L1275-L1277.

Nakahara, K. et al., "Improved External Efficiency InGaN-Based Light-Emitting Diodes with Transparent Conductive Ga-Doped ZnO as p-Electrodes," Jpn. J. Appl. Phys., 2004, vol. 43, No. 2A, pp. L180-L182.

Nakamura, S. et al., "High-Brightness InGaN Blue, Green and Yellow Light-Emitting Diodes with Quantum Well Structures," Jpn. J. Appl. Phys., Jul. 1, 1995, vol. 34, Part 2, No. 7A, pp. L797-L799.

Narukawa, Y. et al., "Ultra-High Efficiency White Light Emitting Diodes," Jpn. J. Appl. Phys., 2006, vol. 45, No. 41, pp. L1084-L1086.

\* cited by examiner

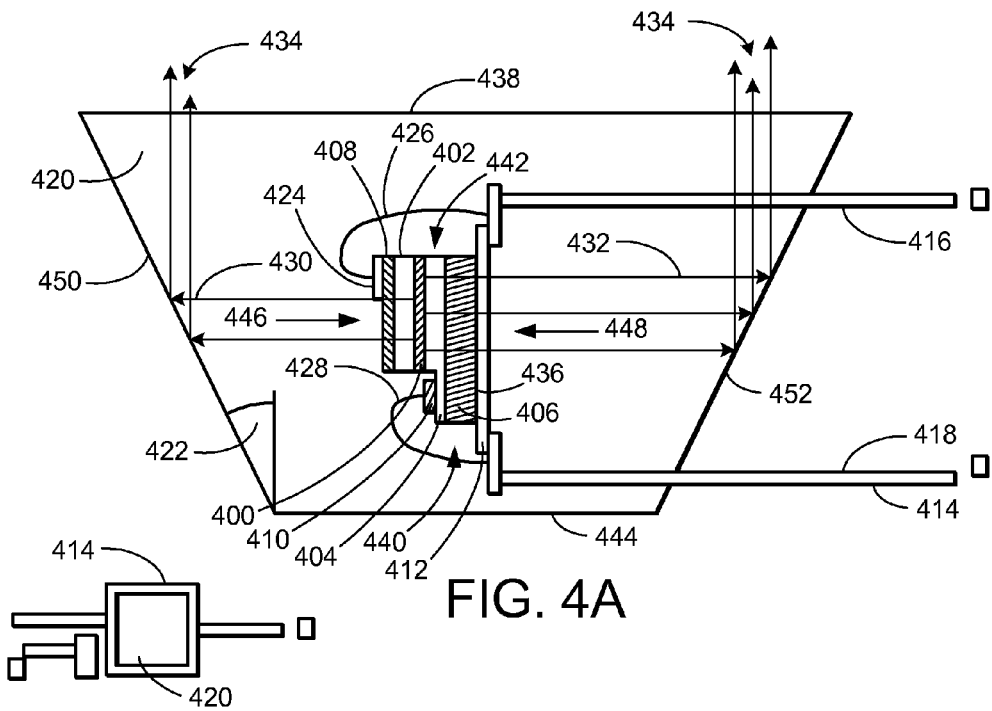

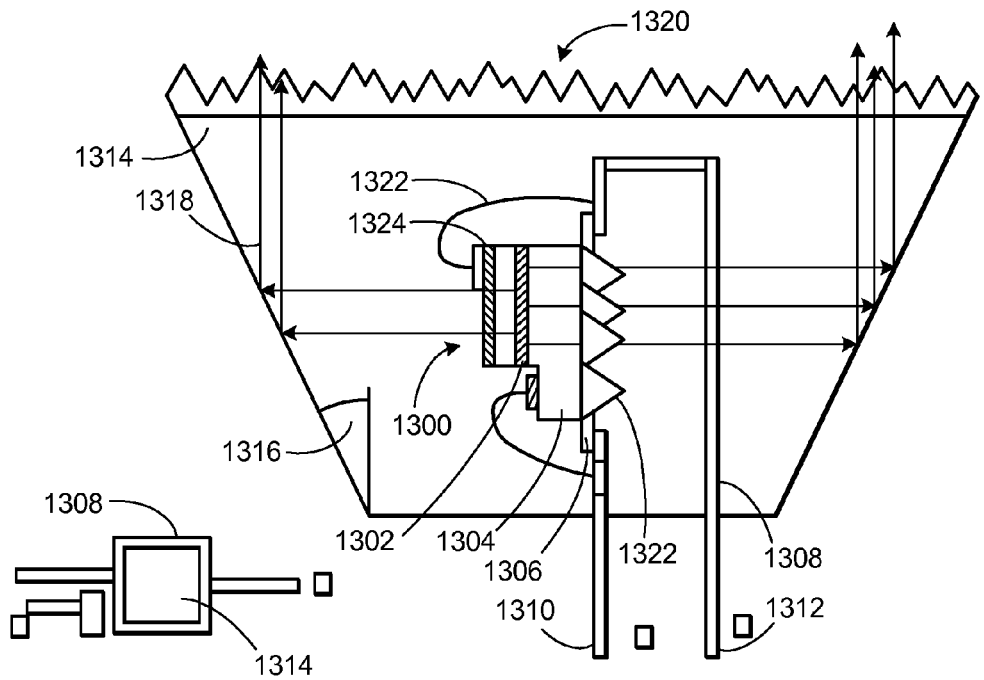
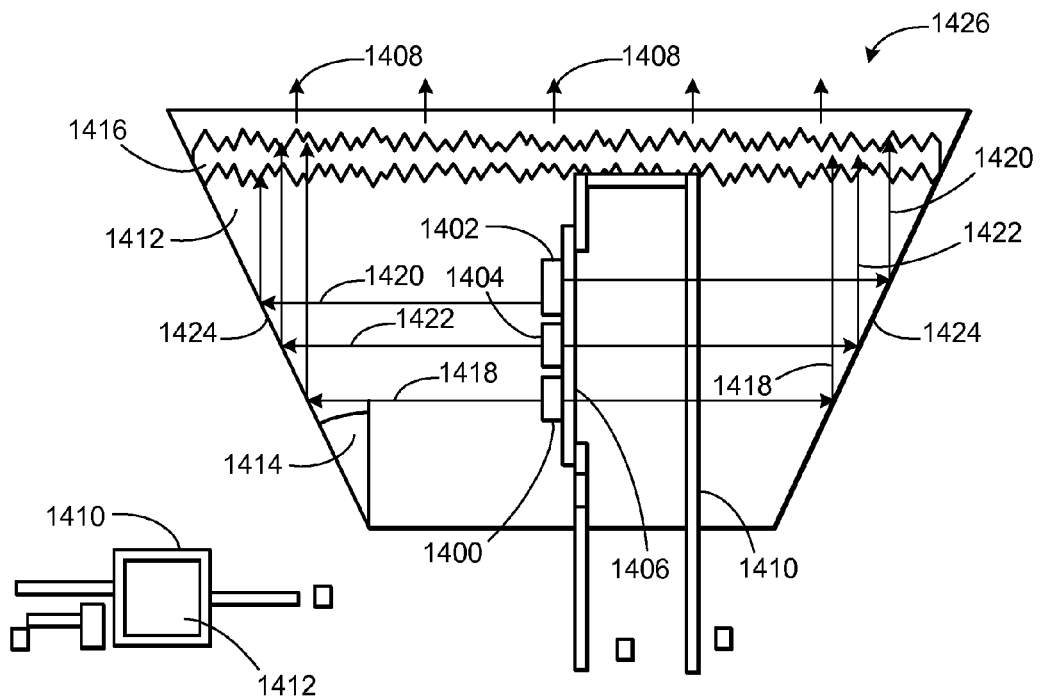

STANDING TRANSPARENT MIRRORLESS LIGHT EMITTING DIODE

CROSS-REFERENCE TO RELATED APPLICATIONS

This application is a continuation of co-pending and commonly-assigned U.S. Utility application Ser. No. 11/940,883, filed on Nov. 15, 2007, by Shuji Nakamura and Steven P. DenBaars, entitled "STANDING TRANSPARENT MIRRORLESS LIGHT EMITTING DIODE,", which application claims the benefit under 35 U.S.C. Section 119(e) of co-pending and commonly-assigned U.S. Provisional Application Ser. No. 60/866,017, filed on Nov. 15, 2006, by Shuji Nakamura and Steven P. DenBaars, entitled "STANDING TRANSPARENT MIRRORLESS LIGHT EMITTING DIODE,", both of which applications are incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING,", which application claims the benefit under 35 U.S.C Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,", now U.S. Pat. No. 7,344,958, issued Mar. 18, 2008, which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS,";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERITCAL EMITTING, BEAM SHAPED, DISTRIBUTED FEEDBACK (DFB) LASERS BY GROWTH OVER A PATTERNED SUBSTRATE,", now U.S. Pat. No. 7,345,298, issued Mar. 18, 2008;

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,", which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,";

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,", which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS, ";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,", which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,", which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD,", U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,", and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH,", which application claims the benefit under 35 U.S.C Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),", which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED),", which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),", and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),"; U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMI-POLAR (Al,In,Ga,B)N OPTOELECTRONIC DEVICES,", which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMI-POLAR (Al,In,Ga,B)N OPTOELECTRONIC DEVICES,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", which application claims the benefit under 35 U.S.C Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,", and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,", which application claims the benefit under 35 U.S.C Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,866, filed on Nov. 15, 2007, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS,", which application claims the benefit under 35 U.S.C Section 119(e) of U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS,";

U.S. Utility patent application Ser. No. 11/940,876, filed on Nov. 15, 2007, filed on same date herewith, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,", which application claims the benefit under 35 U.S.C Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE,", which application claims the benefit under 35 U.S.C Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED,", which application claims the benefit under 35 U.S.C Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,"; and U.S. Utility patent application Ser. No. 11/940,898, filed on Nov. 15, 2007, by Steven P. DenBaars, Shuji Nakamura and James S. Speck, entitled "TRANSPARENT MIRROR-LESS (TML) LIGHT EMITTING DIODE,", which application claims the benefit under 35 U.S.C Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

all of which applications are incorporated by reference herein.

BACKGROUND OF THE INVENTION

1. Field of the Invention

The present invention is related to light extraction from light emitting diodes (LEDs).

2. Description of the Related Art (Note: This application references a number of different publications as indicated throughout the specification. In addition, a list of a number of different publications can be found below in the section entitled "References." Each of these publications is incorporated by reference herein.)

In a conventional LED, in order to increase the light output power from the front side of the LED, the emitted light is reflected by a mirror placed on the backside of the substrate or is reflected by a mirror coating on the lead frame, even if there are no mirrors on the backside of the sapphire substrate and even if the bonding material is transparent on the emission wavelength. However, this reflected light is re-absorbed by the emitting layer (active layer), because the photon energy is almost same as the band-gap energy of the light emitting species, such as AlInGaN multi-quantum wells (MQWs). The efficiency or output power of the LEDs is decreased due to this re-absorption of the LED light by the emitting layer. See, for example, FIGS. 1, 2 and 3, which are described in more detail below. See also J. J. Appl. Phys. 34, L797-99 (1995) and J. J. Appl. Phys. 43, L180-82 (2004).

What is needed in the art are LED structures that more effectively extract light. The present invention satisfies that need.

SUMMARY OF THE INVENTION

The present invention describes an (Al, Ga, In)N light emitting diode (LED) in which multi-directional light can be extracted from one or more surfaces of the LED before entering a shaped optical element and subsequently being extracted to air. In particular, the LED is embedded in or combined with a shaped optical element comprising an epoxy, glass, silicon or other transparent material molded into an inverted cone shape, wherein most of the light entering the inverted cone shape lies within a critical angle and is extracted.

Light is emitted from the LED in a direction substantially perpendicular to a direction that light is emitted from the shaped optical element, because an emitting surface of the LED is substantially perpendicular to an emitting surface of the shaped optical element. In this context, the light is emitted from the shaped optical element in a direction parallel to a plane of the LED's epitaxial layers. Moreover, light may be extracted from multiple sides of the LED, namely the top (front) and bottom (back) sides of the LED. Further, the LED may reside on a transparent plate in a lead frame that allows the light to be extracted from multiple sides of the LED.

The inverted cone shape has side walls positioned at an angle to the inverted cone shape's base, wherein the angle is more than $\sin^{-1}(n_1/n_2)$, $n_1$ is a refractive index of air, and $n_2$ is a refractive index of the inverted cone shape's material. The light is reflected to a top surface of the inverted cone shape by the side walls of the inverted cone shape for emission through the top surface of the inverted cone shape.

The shaped optical element may be shaped, patterned, textured or roughened to increase the light extraction at the top (i.e., light emitting) surface of the shaped optical element. In addition, a phosphor layer may be located on or in the shaped optical element, wherein the phosphor layer is shaped, patterned, textured or roughened to increase the light extraction.

All layers of the LED may be transparent for an emission wavelength, except for an emitting layer. In addition, the LED may include one or more transparent contact layers, wherein the transparent contact layer is shaped, patterned, textured or roughened to increase the light extraction. Moreover, a current spreading layer may be deposited on the LED before the transparent contact layer. Further, the LED may include a transparent substrate, wherein the transparent substrate is shaped, patterned, textured or roughened to increase the light extraction.

BRIEF DESCRIPTION OF THE DRAWINGS

Referring now to the drawings in which like reference numbers represent corresponding parts throughout:

FIGS. 4A-B, 5A-B, 6A-B and 7A-B are schematic illustrations (cross-sections) of LED structures grown on a flat sapphire substrate or a patterned sapphire substrate (PSS).

FIGS. 11A-B and 12A-B are schematic illustrations of LED structures grown using a bulk GaN, ZnO, SiC, Spinel, or other transparent material substrate, wherein FIGS. 11B and 12B are scanning electron micrographs of the textured LED surface.

FIG. 13A-B is a schematic illustration of an LED structure grown using a patterned sapphire substrate or textured GaN, ZnO, SiC, Spinel or other transparent material substrate.

FIG. 14A-B is a schematic illustration of an LED structure that includes blue, green and red LEDs.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

In the following description of the figures, the details of the LEDs structure are not shown. Only the emitting layer (usually AlInGaN MQW), p-type GaN, n-GaN and sapphire substrate are shown. Of course, there may be other layers in the LED structure, such as a p-AlGaN electron blocking layer, InGaN/GaN super lattices etc. In this invention, the most important parts are surface(s) of the LED structure, because the light extraction efficiency is determined mainly by the surface layer or condition of the epitaxial wafers. Consequently, only some parts (the surface layers) of the LED are shown in all of the figures.

Conventional LED Structures

Figure 1:
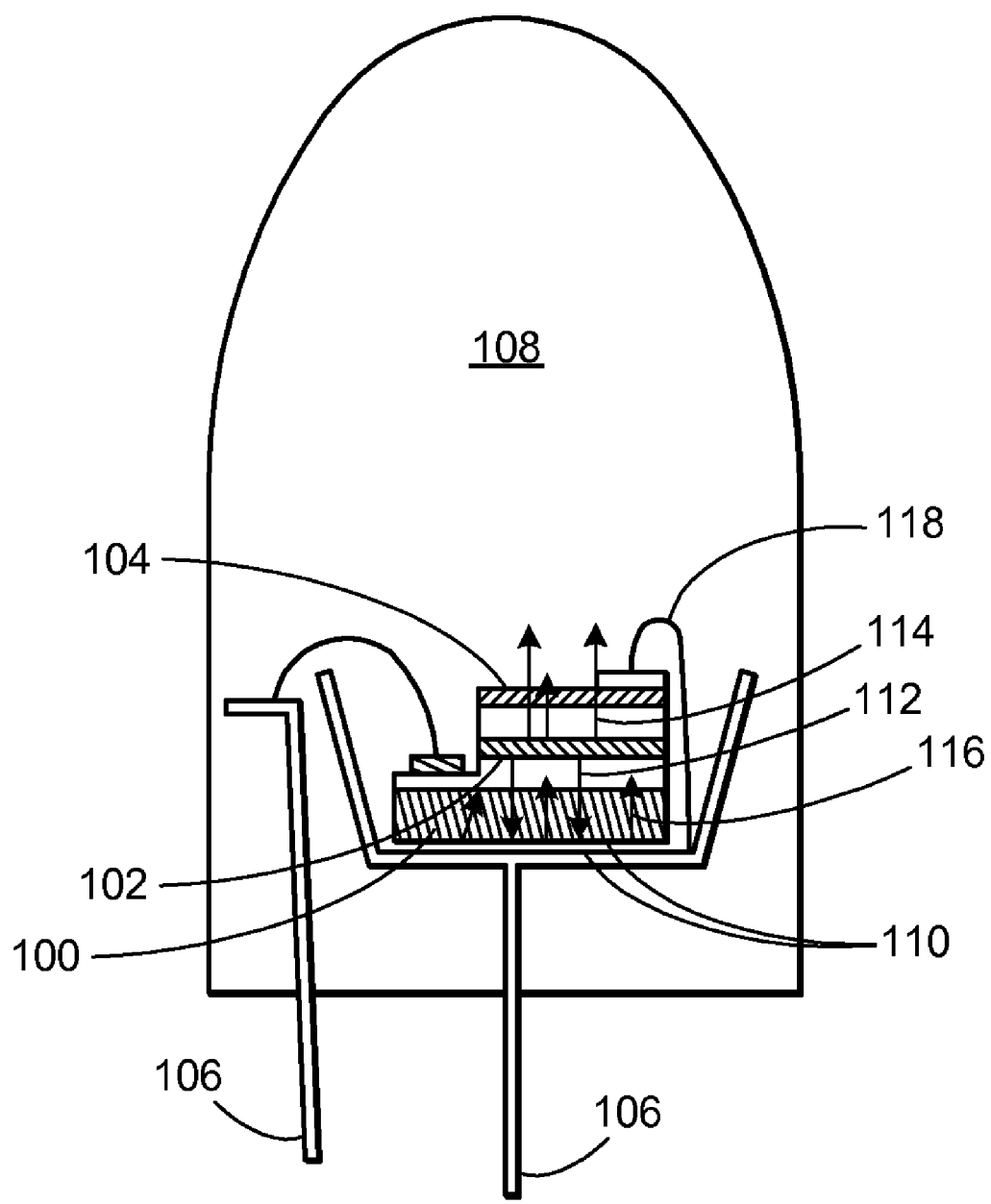
FIGS. 1, 2 and 3 are schematic illustrations (cross-sections) of conventional LEDs.
Figure 2:
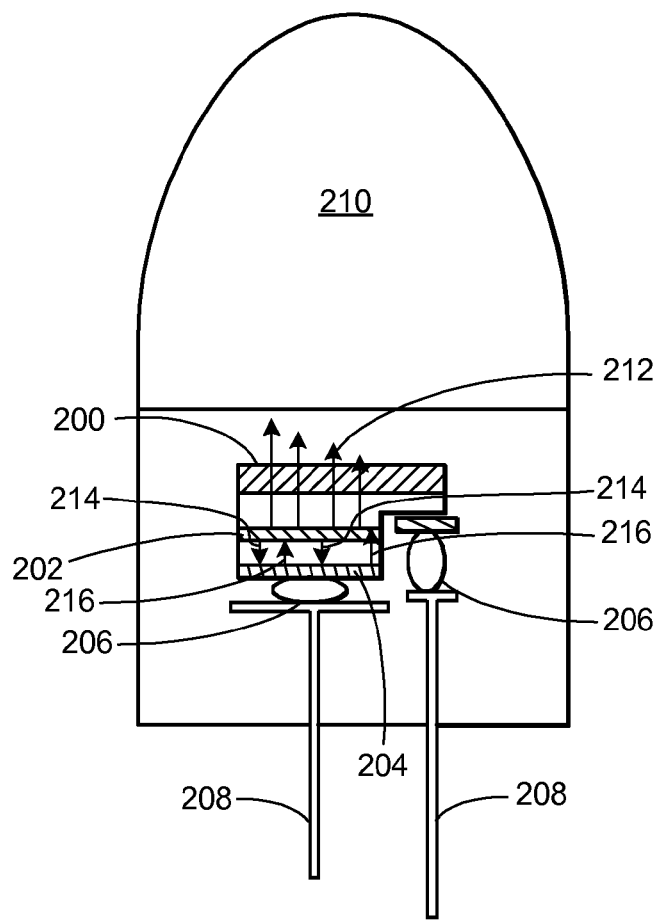
Figure 3:
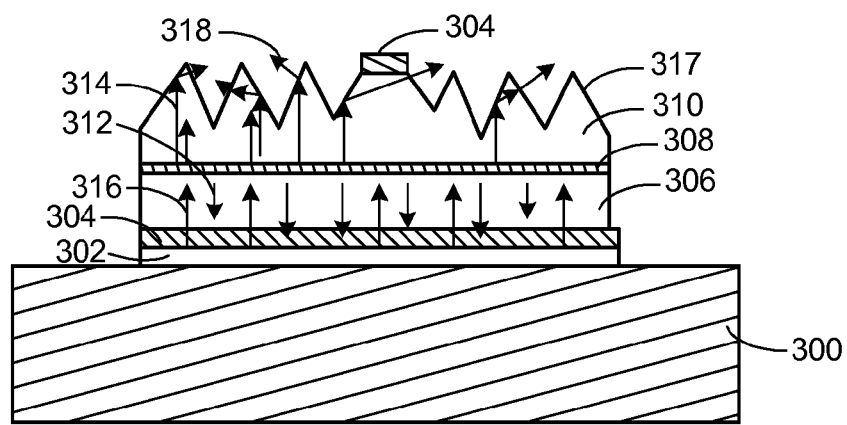

FIGS. 1, 2 and 3 are schematic illustrations of conventional LED structures.

In conventional LEDs, in order to increase the light output power from the front side of the LED, the emitting light is reflected by the mirror on the backside of the sapphire substrate or the mirror coating on the lead frame, even if there are no mirrors on the backside of the sapphire substrate and even if the bonding material is transparent at the emission wavelength. This reflected light is re-absorbed by the emitting layer (active layer), because the photon energy is almost the same as the band-gap energy of the quantum wells of an AlInGaN multi-quantum well (MQW) structure. However, the efficiency or output power of the LED is decreased, due to the re-absorption by the emitting layer.

In FIG. 1, a conventional LED includes a sapphire substrate 100, emitting layer 102 (active layer), and semi-transparent or transparent electrodes 104, such as ITO or ZnO. The LED is die-bonded on a lead frame 106 with a clear epoxy molding 108 without any mirror on the back side of the sapphire substrate 100. In this case, the coating material on the lead frame 106, or the surface of the lead frame 106, becomes a mirror 110. If there is a mirror 110 on the back side of the substrate 100, the LED chip is die-bonded using an Ag paste. The active layer 102 emits light 112 towards the substrate 100 and emits light 114 towards the electrodes 104. The emitting light 112 is reflected by the mirror 110 towards the electrode 104, becoming reflected light 116 which is transmitted by the electrode 104 to escape the LED. The LED is wire bonded 118 to the lead frame 106.

In FIG. 2, the conventional LED is similar to that shown in FIG. 1, except that it is a flip-chip LED. The LED includes a sapphire substrate 200 and emitting layer 202 (active layer), and a highly reflective mirror 204. The LED is die-bonded 206 onto a lead frame 208 and embedded in a clear epoxy molding 210. The active layer 202 emits light 212 towards the substrate 200 and emits light 214 towards the highly reflective mirror 204. The emitting light 214 is reflected by the mirror 204 towards the substrate 200, becoming reflected light 216 which is transmitted by the substrate 200 to escape the LED.

In FIG. 3, the conventional LED includes a conducting sub-mount 300, high reflectivity mirror 302 (with Ag>94% reflectivity (R)), a transparent ITO layer 304, a p-GaN layer 306, an emitting or active layer 308, and an n-GaN layer 310. The LED is shown without the epoxy molding, although similar molding may be used. The emitting layer 308 emits LED emissions 312 towards the mirror 302 and emits LED emissions 314 towards the n-GaN layer 310. The emission 312 of the emitting layer 308 is reflected by the mirror 302, where the reflective light emissions 316 are re-absorbed by the emitting layer 308. The efficiency of the LED is decreased due to this re-absorption. The n-GaN layer may be roughened 317 to enhance extraction 318 of LED emissions 314.

Improved LED Structures

FIGS. 4-14 are schematic illustrations of improved LED structures according to the preferred embodiments of the present invention. In these figures, a number of different opto-electronic devices are shown, each comprising a shaped optical element and an LED embedded in or combined with the shaped optical element comprising an epoxy, glass, silicon or other transparent material molded into an inverted cone shape, wherein most of the light entering the inverted cone shape lies within a critical angle and is extracted. Light is emitted from the LED in a direction substantially perpendicular to a direction that light is emitted from the shaped optical element, because an emitting surface of the LED is substantially perpendicular to an emitting surface of the shaped optical element. In this context, the light is emitted from the shaped optical element in a direction parallel to a plane of the LED's epitaxial layers. Consequently, multi-directional light can be extracted from multiple surfaces of the LED before entering the shaped optical element and subsequently being extracted to air. Further, the LED may reside on a transparent plate in a lead frame that allows the light to be extracted from multiple sides of the LED.

The inverted cone shape has side walls positioned at an angle to the inverted cone shape's base, wherein the angle is more than $\sin^{-1}(n_1/n_2)$, $n_1$ is a refractive index of air, and $n_2$ is a refractive index of the inverted cone shape's material. The light is reflected to a top surface of the inverted cone shape by the side walls of the inverted cone shape for emission through the top surface of the inverted cone shape.

The shaped optical element may be shaped, patterned, textured or roughened to increase the light extraction. In addition, a phosphor layer may be located on or in the shaped optical element, wherein the phosphor layer is shaped, patterned, textured or roughened to increase the light extraction.

All layers of the LED may be transparent for an emission wavelength, except for an emitting layer. In addition, the LED may include one or more transparent contact layers, wherein the transparent contact layer is shaped, patterned, textured or roughened to increase the light extraction. Moreover, a current spreading layer may be deposited on the LED before the transparent contact layer. Further, the LED may include a transparent substrate, wherein the transparent substrate is shaped, patterned, textured or roughened to increase the light extraction.

Specific LED Structures

FIG. 4A shows an LED including an emitting layer 400, a p-type layer 402, an n-type layer 404, a sapphire substrate or patterned sapphire substrate (PSS) 406, ITO or ZnO 408 contacting the p-type layer 402, and an ohmic contact 410 to the n-type layer 404. The LED resides on a transparent glass plate 412 attached to a metal lead frame 414 having electrodes 416 and 418. The LED is embedded in an inverted cone shape 420 comprised of epoxy or glass, with an angle 422 of the inverted cone. The LED's bonding pad 424 is wire bonded 426 to the electrode 416 and the LED's bonding pad 410 is wire bonded 428 to the electrode 418. The emitting layer 400 emits light 430 and 432 which is reflected to become reflected LED light 434.

FIG. 4B shows a top view of the lead frame 414 and inverted cone made of glass 420.

In FIG. 4A, the LED structure is grown on a flat sapphire substrate or a patterned sapphire substrate (PSS) 406 to improve the light extraction efficiency through the interface between the GaN 404 and sapphire substrate 406.

Also, the backside 436 (in contact with the plate 412) of the sapphire substrate 406 is roughened to increase the light extraction from the sapphire substrate 406 to air, epoxy or glass 420. The best shape for the roughened surface is a cone-shaped surface (e.g., microcones).

ITO or ZnO 408 may be deposited on the p-type GaN 402, where a bonding pad 424 is formed on the ITO or ZnO 408, and an ohmic contact/bonding pad 410 is formed on the n-type GaN 404, after exposing the n-type GaN 404 by a selective etching through the p-type GaN 402.

Finally, the LED may be embedded in or combined with a shaped optical element, such as an epoxy, glass, silicon or other material that is molded into an inverted cone shape 420, which performs better light extraction. The angle 422 of the inverted cone shape is designed to reflect light to the front side 438 of the device.

As shown in FIGS. 4A, 5A, 6A and 7A, the present invention stands the LED on end 440, i.e., rotates the position of the LED within the inverted cone shape by approximately 90°, as compared to a conventional LED, in order to extract light more effectively from the front side 438 of the LED. Other rotation angles may be used as well. Moreover, light may be extracted from the other side 442 of the LED, assuming it is rotated in the other direction.

In this example, when the inverted cone shape comprises an isosceles trapezoid, this position of the LED results in the sides of the LED 440, 442 facing the parallel sides of the trapezoid 444, 438, respectively, i.e., one side of the LED 442 facing the "top" 438 of the trapezoid and another side of the LED 440 facing the "bottom" 444 of the trapezoid, with the "top" 446 and "bottom" 448 sides of the LED facing the congruent legs 450, 452 of the trapezoid. Light 430, 432 is reflected by surfaces 450, 452, respectively, to escape the inverted cone 420 through surface 438.

Moreover, in this example, the refractive index of the air is $n_1=1$, while the refractive index of the epoxy used in the inverted cone shape is $n_2=1.5$. Thus, the critical angle for the reflection is $\sin^{-1}(1/1.5)$. Consequently, the angle of the inverted cone 422, 516, 616, and 716 shown in FIGS. 4A, 5A, 6A and 7A should be more than $\sin^{-1}(1/1.5)$. The LED light is effectively extracted from the top surface 438 of the inverted cone shape or from a direction parallel to the epitaxial layers of the LED.

Note also that the anode and cathode electrodes 416 and 418 for the power supply may extend through a side wall 450, 452, top 438 or bottom 444 of the inverted cone shape 420.

FIG. 5A shows an LED 500 including an emitting layer 502 and a sapphire substrate or patterned sapphire substrate (PSS) 504. The LED 500 sits on a transparent glass plate 506 attached to a metal lead frame 508 having electrodes 510 and 512. The LED 500 is embedded in an inverted cone 514 made or epoxy or glass, having an angle 516. The emitting layer 502 emits LED light 518 which is reflected by the inverted cone 514 out of the front surface 520. The LED 500 is wire bonded 522 to the metal lead frame 508.

FIG. 5B shows a top view of the lead frame 508 and inverted cone made of glass 514.

In FIG. 5A, the anode and cathode electrodes 512 and 510 for the power supply extend through the bottom 524 of the inverted cone shape 514. Otherwise, the structure of FIG. 5A is the same as that shown in FIG. 4A.

Figures 6A, 6B:
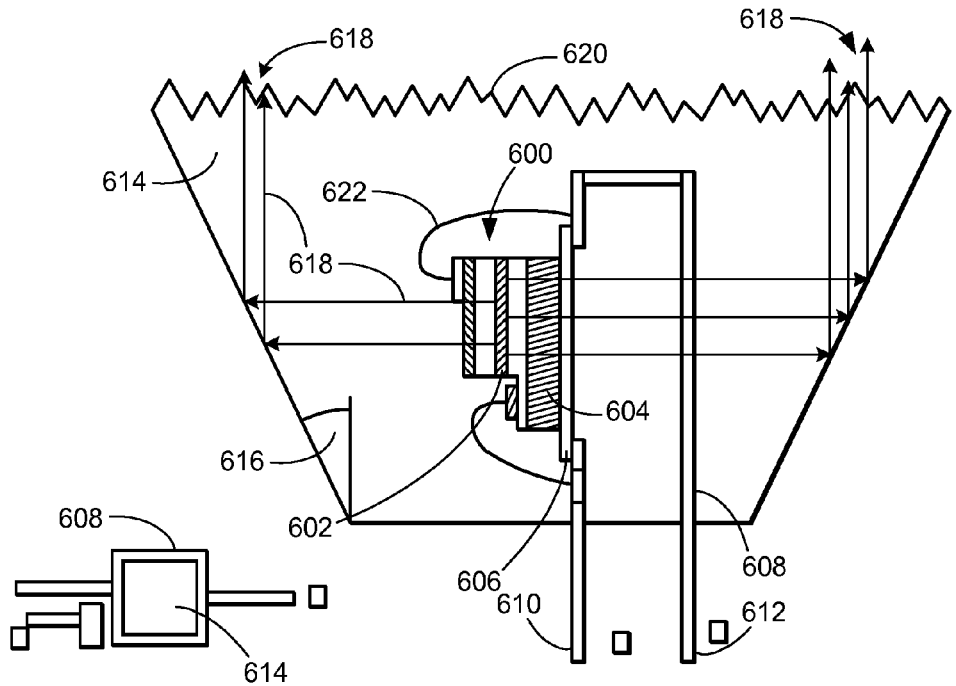

FIG. 6A shows an LED 600 including an emitting layer 602 and a sapphire substrate or patterned sapphire substrate (PSS) 604. The LED 600 is attached on a transparent glass plate 606 attached to a metal lead frame 608 having electrodes 610 and 612. The LED 600 is embedded in an inverted cone 614 made or epoxy or glass, having an angle 616. The emitting layer 602 emits LED light 618 which is reflected by the inverted cone 614 out of the front surface 620. The LED 600 is wire bonded 622 to the metal lead frame 608.

FIG. 6B shows a top view of the lead frame 608 and inverted cone made of glass 614.

In FIG. 6A, the top surface 620 of the inverted cone shape 514 of FIG. 5 is roughened to improve light extraction from the molding 614.

Figures 7A, 7B:
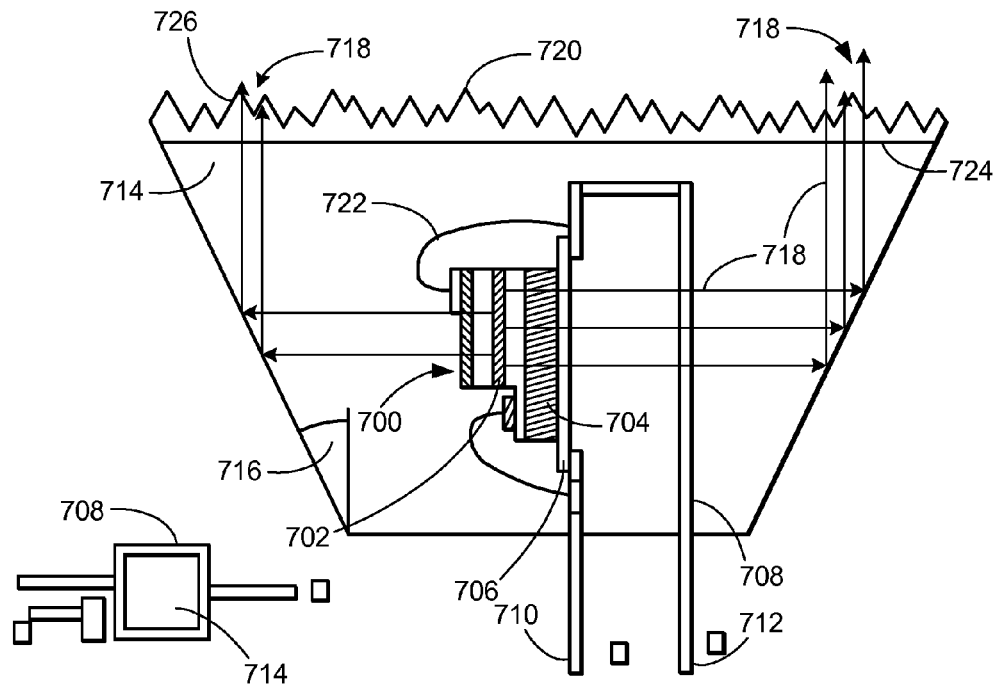

FIG. 7A shows an LED 700 including an emitting layer 702 and a sapphire substrate or patterned sapphire substrate (PSS) 704. The LED 700 sits on a transparent glass plate 706 attached to a metal lead frame 708 having electrodes 710 and 712. The LED 700 is embedded in an inverted cone 714 made or epoxy or glass, having an angle 716. The emitting layer 702 emits LED light 718 which is reflected by the inverted cone 714 out of the front surface 720. The LED 700 is wire bonded 722 to the metal lead frame 708.

FIG. 7B shows a top view of the lead frame 708 and inverted cone made of glass 714.

In FIG. 7A, a phosphor layer 724 is placed near the top surface 720 of the inverted cone shape 714. Preferably, the phosphor layer 724 should be placed as far away as possible from the LED 700. In this case, the conversion efficiency of the blue light to white light is increased due to a small re-absorption of the LED light due to a small back scattering by the phosphor to the LED. Note also that the surface 726 of the phosphor layer 724 may be roughened to improve the light extraction through the phosphor 724.

Figure 8A:
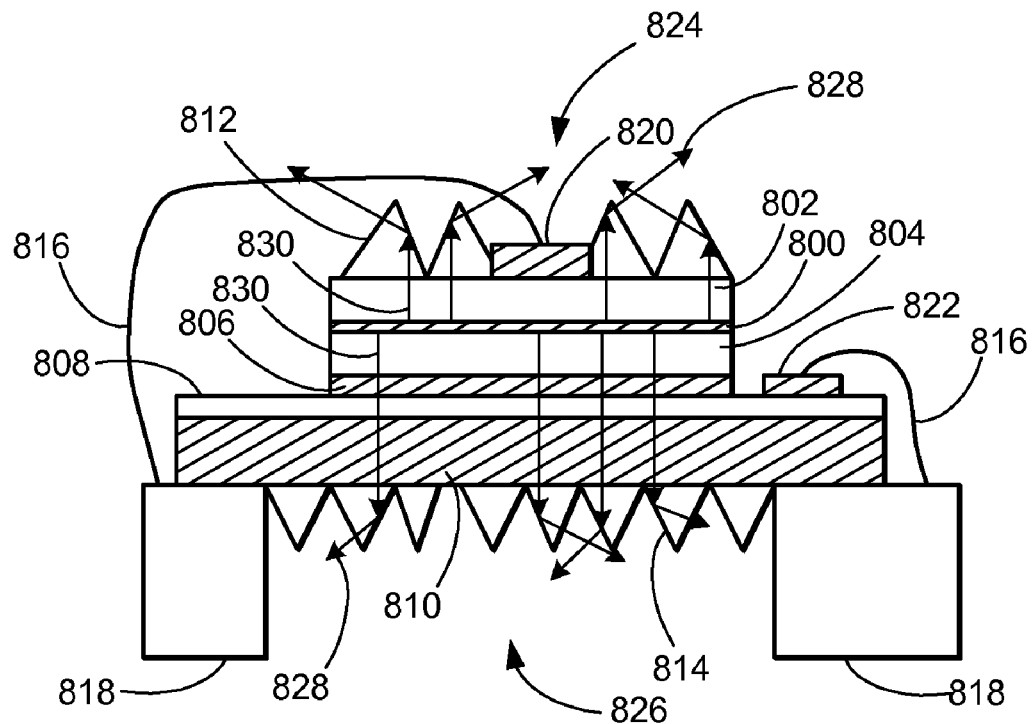
FIGS. 8A-B, 9 and 10 are schematic illustrations (cross-sections) of LED structures grown on a sapphire substrate with a lead frame designed to extract the light from the back side of the LED.
Figure 8B:
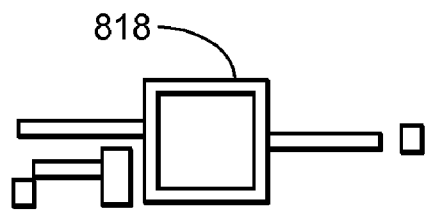
Figure 9:
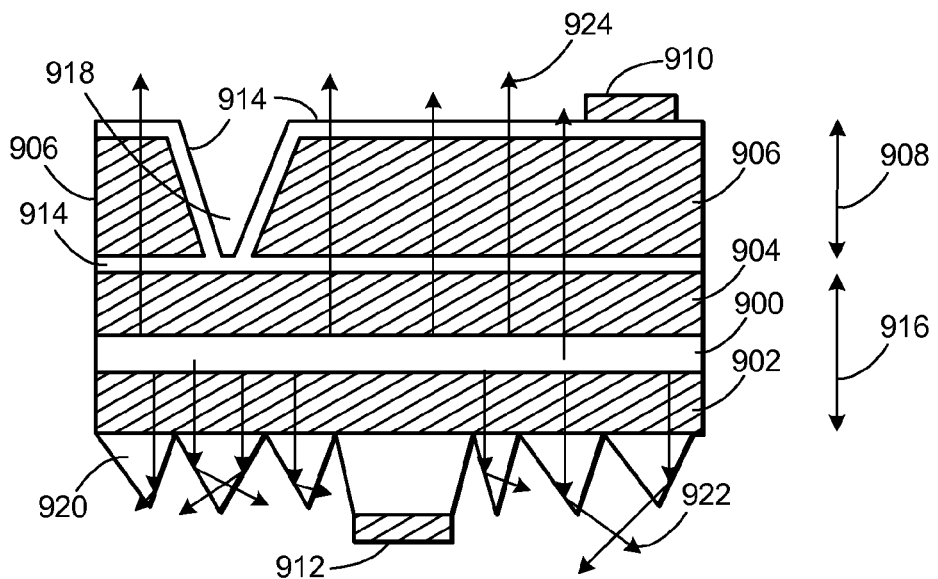
Figure 10:
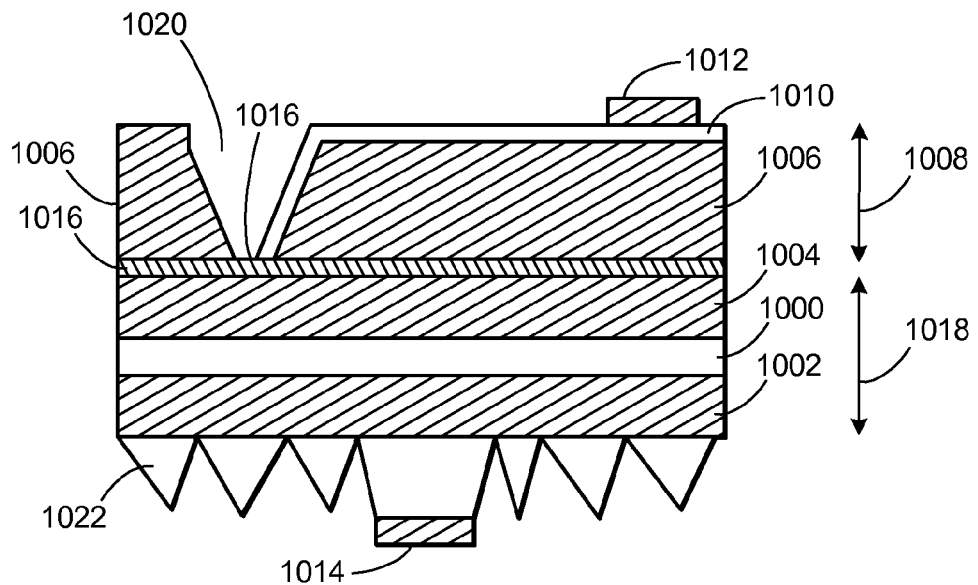

FIGS. 8, 9 and 10 are schematic illustrations of LED structures grown on a sapphire substrate with a lead frame designed to extract the light from the back side of the LED.

FIG. 8A is a schematic illustrating an LED comprising an emitting layer 800, an n-type GaN layer 802, a p-type GaN layer 804, an ITO layer 806, and a second ITO layer 808 on glass 810. The GaN of the LED has a roughened cone shaped surface 812 and the glass 810 has a roughened cone shaped surfaces 814. The LED is attached and wire bonded 816 to a lead frame 818 via the LED's bonding pads 820, 822.

FIG. 8B shows a top view of the lead frame 818.

In FIG. 8A, the LED structure is grown on a sapphire substrate. ITO 806 is deposited on a p-type GaN layer 804. ITO coated glass 810 is attached onto the ITO 806 using an epoxy as a glue. The other side 814 of the glass 810 is roughened by a sandblasting step. The sapphire substrate is removed using a laser de-bonding technique. The nitrogen-face GaN is etched with wet etching, such as with KOH or HCL. Finally, a cone-shaped surface 812 is formed on nitrogen-face GaN.

The LED is placed on a lead frame 818, which works to remove heat from the LED. Wire bonding 816 is performed between bonding pads 820, 822 of the LED and the lead frame 818 to flow current through the lead frame 818.

There are no intentional mirrors at the front 824 or back sides 826 of the LED, so emissions are not reflected. Moreover, the lead frame 818 is designed to effectively extract the light from the back side 826 of the LED. Thus, the LED light 828 is effectively extracted from both sides 824, 826 of the LED. The roughened surfaces 812 and 814 increase transmission of extracted light 828. Also, the efficiency of the LED is increased due to a lack of the re-absorption of the emissions 830. All emissions 830 can get out of the semiconductor.

An ohmic contact may be placed below the bonding pad of the n-GaN, although this is not shown in FIG. 8A.

FIG. 9 is a schematic illustrating an LED comprising an InGaN multi quantum well active layer 900, an n-GaN layer 902, a p-GaN layer 904, an epoxy layer 906 (approximately 400 microns thick 908), a bonding pad 910, an ohmic electrode/bonding pad 912, and ITO or ZnO 914. The thickness 916 of the n-GaN 902, active layer 900 and p-GaN layer 904 is approximately 5 microns.

FIG. 10 is a schematic illustrating an LED comprising an InGaN multi quantum well active layer 1000, an n-GaN layer 1002, a p-GaN layer 1004, an epoxy layer 1006 (approximately 400 microns thick 1008), a narrow stripe Au connection 1010, a bonding pad 1012, an ohmic electrode/bonding pad 1014, and ITO or ZnO 1016. The thickness 1018 of the n-GaN 1002, active layer 1000 and p-GaN layer 1004 is approximately 5 microns.

In FIGS. 9 and 10, a thick epoxy 906, 1006 is used, rather than the glass 810 shown in FIG. 8A. To make the electric contact, the epoxy 906, 1006 is partially removed, and ITO 914 or a narrow stripe of Au 1010 is deposited on the epoxy 906, 1006, as well as within a hole or depression 918, 1020 in the surface of the epoxy 906, 1006. Otherwise, the structure of FIGS. 9 and 10 is the same as that shown in FIG. 8. A cone-shaped surface 920, 1022 is on the nitrogen face GaN. The cone-shaped surface 920, 1022 enhances extraction of light 922.

Also in FIGS. 8, 9 and 10, if a GaN substrate is used instead of a sapphire substrate, laser de-bonding is not required and, as a result, the glass 810 and thick epoxy 906, 1006 submount are not required. After the LED structure is grown on the GaN substrate, ITO 914 is deposited on the p-type GaN 904 and the backside of the GaN substrate (i.e., the nitrogen-face GaN) is etched with a wet etching, such as KOH and HCL. A cone-shaped surface 920 is then formed on the nitrogen face GaN. Otherwise, the structure is the same as that shown in FIG. 8.

In addition, when the surface of the ITO 914 is roughened, the light extraction through the ITO 914 is increased. Without ITO 914 on the p-type GaN 904, the roughening of the surface of p-type GaN 904 is effective to increase the light extraction through the p-type GaN 904.

Finally, an ohmic contact for the n-type GaN 912, ITO or ZnO is used after the surface roughening of the nitrogen-face GaN.

Note that the ITO and ZnO 914 have a similar refractive index of GaN and, as a result, the light reflection at the interface between the ITO or ZnO 914 and the GaN is minimized.

Figure 11B:
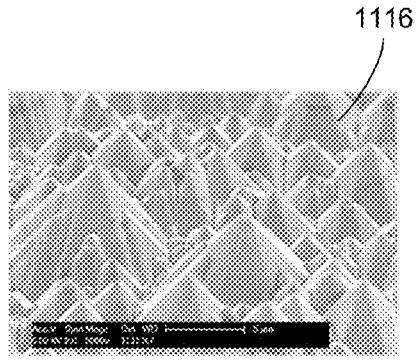
Figure 11A:
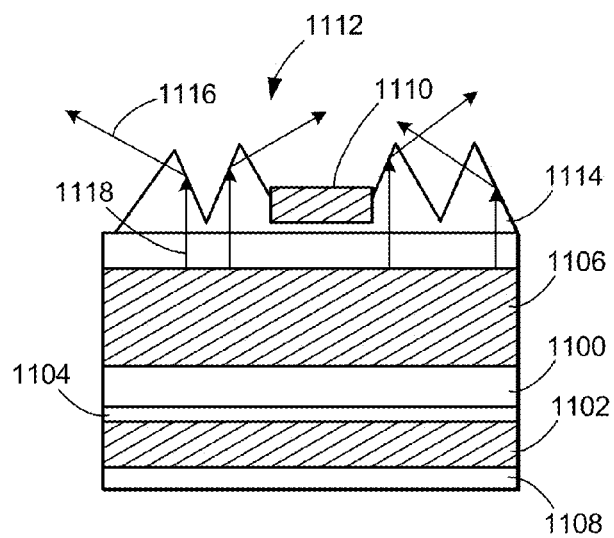

FIG. 11A illustrates an LED structure comprising an n-type GaN layer 1100, p-type GaN layer 1102, active layer 1104, bulk substrate 1106, transparent contact 1108, and n-type electrode 1110. In FIG. 11, the front side 1112 of the LED is textured into cones 1114 to enhance light extraction 1116 of LED emissions 1118.

Figure 12B:
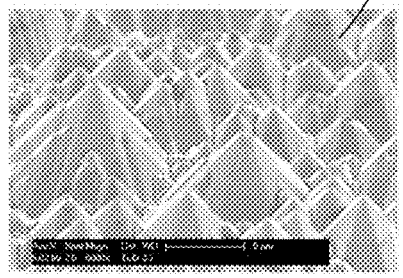
Figure 12A:
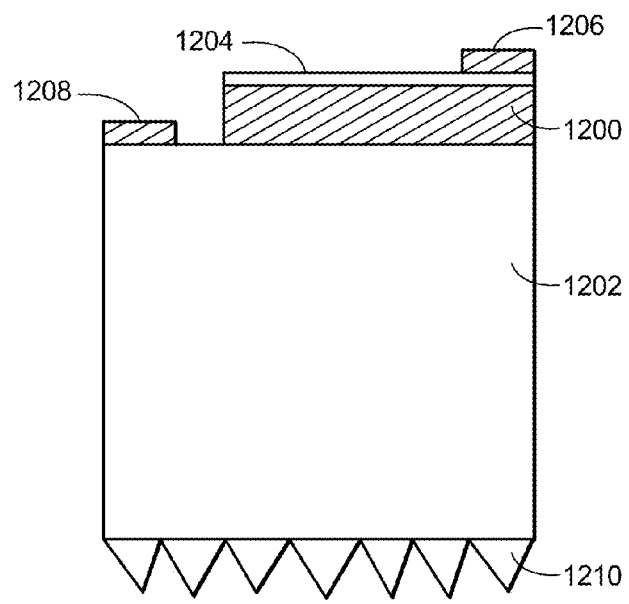

FIG. 12A illustrates an LED structure 1200, on a bulk GaN substrate 1202, having a transparent contact or transparent conducting electrode 1204, a p-contact 1206, and an re-contact 1208. In FIG. 12A, the backside side of substrate 1202 is textured into cones 1210 (textured surface).

FIGS. 11A and 12A are schematic illustrations of LED structures 1200 grown using a bulk GaN, ZnO, SiC, Spinel 1106, 1202 or other transparent material substrate. Note that the surface 1208, 1112 of the substrate 1106, 1202 may be textured 1210, 1114, as shown by FIGS. 11B and 12B. FIG. 11B is an image of the textured surface 1114 of the substrate 1106 and FIG. 12B is an image of the textured surface 1202 of the substrate 1210.

FIG. 13A shows an LED 1300 including an emitting layer 1302 and a sapphire substrate or patterned sapphire substrate (PSS) 1304. The LED 1300 sits on a transparent glass plate 1306 attached to a metal lead frame 1308 having electrodes 1310 and 1312. The LED 1300 is embedded in an inverted cone 1314 made or epoxy or glass, having an angle 1316. The emitting layer 1302 emits LED light 1318 which is reflected by the inverted cone 1314 out of the front surface 1320. The LED 1300 is wire bonded 1322 to the metal lead frame 1308. The LED 1300 also has a transparent contact layer 1324 (for example, ITO or ZnO).

FIG. 13B shows a top view of the lead frame 1308 and inverted cone made of glass 1314.

FIG. 13A is a schematic illustration of an LED structure grown using a patterned sapphire substrate or textured GaN, ZnO, SiC, Spinel substrate 1304, or other transparent material substrate. Note that the substrate 1304 may be textured 1322.

FIG. 14A is a schematic illustration of an LED structure that includes blue 1400, green 1402 and red 1404 LEDs or LED emitting layers that are placed on the transparent plate 1406, in order to make white LED light 1408 from the three primary color LEDs 1400, 1402 and 1404. The transparent plate 1406 (e.g. glass) sits on a metal lead frame 1410. The LEDs are embedded in a molding material such as an inverted cone made of epoxy or glass 1412 having an angle 1414, wherein the inverted cone 1412 contains a light mixing layer 1416. The blue 1418, green 1420 and red 1422 light emitted by the emitting layers 1400, 1402 and 1404 is reflected by the surfaces 1424 towards the light mixing layer 1416 which layer 1416 mixes the blue 1418, green 1420 and red 1422 light to create the white light 1408 extracted from the inverted cone 1414.

FIG. 14B shows a top view of the lead frame 1410 and inverted cone made of glass 1412.

Preferably, the number of blue 1400, green 1402 and red 1404 LED chips are adjusted to make an optimum white light LED. A light mixing layer 1416 may be placed inside of the molding material 1414 in order to create the white light 1408 by mixing three primary colors of light (red 1422, blue 1418 and green 1420). The light mixing layer 1416 may also perform a uniform diffusion of the mixing light, i.e., the light diffusion layer 1416 is put inside of the molding material to diffuse the light uniformly.

REFERENCES

The following references are incorporated by reference herein:

1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys. 43, L1275-77 (2004).
5. Jpn. J. Appl. Phys. Vol. 45, No. 41, L1084-1086 (2006).
6. Appl. Phys. Lett. 84, 855-57 (2004).
7. J. J. Appl. Phys. 34, L797-99 (1995).
8. J. J. Appl. Phys. 43, L180-82 (2004).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:

1. An opto-electronic device, comprising:
a shaped optical element; and
a light emitting diode (LED) embedded in the shaped optical element;
wherein the LED stands on end within the shaped optical element, such that the light is emitted from a front of the LED in a direction that reflects off a side wall of the shaped optical element so that the light is emitted through a top surface of the shaped optical element.

2. The device of claim 1, wherein the light is emitted from the LED in a direction substantially perpendicular to a direction that the light is emitted from the shaped optical element, because the front of the LED is substantially perpendicular to the top surface of the shaped optical element.

3. The device of claim 1, wherein the front of the LED is substantially perpendicular to the top surface of the shaped optical element.

4. The device of claim 1, wherein the light is emitted from the shaped optical element in a direction parallel to a plane of the LED's epitaxial layers.

5. The device of claim 1, wherein the light is emitted both from the front of the LED and from a back of the LED.

6. The device of claim 1, wherein the shaped optical element comprises an inverted cone shape.

7. The device of claim 1, wherein the shaped optical element is comprised of transparent materials.

8. The device of claim 1, wherein the shaped optical element is shaped, patterned, textured or roughened to increase the light's extraction from the shaped optical element.

9. The device of claim 1, further comprising a phosphor layer located on or in the shaped optical element.

10. The device of claim 1, wherein the LED resides in a lead frame that allows the light to be extracted from multiple sides of the LED.

11. The device of claim 1, wherein all layers of the LED are transparent for an emission wavelength except for an emitting layer.

12. The device of claim 6, wherein a position of the LED is rotated within the inverted cone shape by approximately 90°, as compared to a conventional LED, in order to extract light more effectively from the front of the LED.

13. The device of claim 6, wherein the inverted cone shape has side walls positioned at an angle to the inverted cone shape's base, wherein the angle is more than $\sin^{-1}(n_1/n_2)$, $n_1$ is a refractive index of air, and $n_2$ is a refractive index of the material of the inverted cone shape.

14. The device of claim 9, wherein the phosphor layer is shaped, patterned, textured or roughened to increase the light's extraction through the phosphor layer.

15. The device of claim 10, wherein the LED resides on a transparent plate in the lead frame.

16. A method of fabricating an opto-electronic device, comprising:
   embedding a light emitting diode (LED) in a shaped optical element;
   wherein the LED stands on end within the shaped optical element, such that the light is emitted from a front of the LED in a direction that reflects off a side wall of the shaped optical element so that the light is emitted through a top surface of the shaped optical element.

\* \* \* \* \*